United States Patent
Yu et al.

(10) Patent No.: US 12,207,533 B2
(45) Date of Patent: Jan. 21, 2025

(54) SCREEN TENSIONING DEVICE

(71) Applicant: Yungu (Gu' an) Technology Co., Ltd., Hebei (CN)

(72) Inventors: Shangzhi Yu, Langfang (CN); Liangen Huang, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 415 days.

(21) Appl. No.: 17/591,660

(22) Filed: Feb. 3, 2022

(65) Prior Publication Data
US 2022/0158144 A1 May 19, 2022

Related U.S. Application Data

(63) Continuation of application No. PCT/CN2020/117924, filed on Sep. 25, 2020.

(30) Foreign Application Priority Data

Dec. 24, 2019 (CN) .......................... 201911348992.6

(51) Int. Cl.
*H10K 71/00* (2023.01)
*H10K 71/16* (2023.01)

(52) U.S. Cl.
CPC ........... *H10K 71/00* (2023.02); *H10K 71/164* (2023.02); *H10K 71/166* (2023.02)

(58) Field of Classification Search
CPC .... C23C 14/042; H10K 71/00; H10K 71/166; H10K 71/164
See application file for complete search history.

(56) References Cited

U.S. PATENT DOCUMENTS 2,680,994 A * 6/1954 Wood .................... B25B 11/005
269/21
2,877,538 A * 3/1959 Coulon ............... F16C 32/0651
384/112
(Continued)

FOREIGN PATENT DOCUMENTS

CN 101581347 A 11/2009
CN 107900702 A 4/2018
(Continued)

OTHER PUBLICATIONS

International Search Report (with English Translation) and Written Opinion issued on Dec. 30, 2020 in corresponding International Application No. PCT/CN2020/117924, 10 pages.
(Continued)

*Primary Examiner* — Seahee Hong
(74) *Attorney, Agent, or Firm* — Maier & Maier, PLLC

(57) ABSTRACT

A screen tensioning device includes a supporting frame with a mounting surface and a plurality of air floating assemblies arranged on the mounting surface, each of the air floating assemblies includes an air floating base mounted on the mounting surface; a supporting tray arranged on a side of the air floating base away from the mounting surface, the supporting tray includes a first surface facing the air floating base and a second surface disposed opposite to the first surface and for supporting a mask frame; at least one air hole disposed toward the first surface of the supporting tray, so as to float the supporting tray when air is blown; and a limiting component connected between the air floating base and the supporting tray, and for limiting a displacement of the supporting tray in a direction parallel to the mounting surface.

14 Claims, 9 Drawing Sheets

(56) References Cited

U.S. PATENT DOCUMENTS

| | | | | |
|---|---|---|---|---|
| 3,484,093 A * | 12/1969 | Mermelstein | ......... | B25B 11/005 |
| | | | | 269/21 |
| 5,120,033 A * | 6/1992 | Shoda | ............. | B23Q 1/035 |
| | | | | 269/21 |
| 5,553,837 A * | 9/1996 | Kahle | ............. | B25B 11/005 |
| | | | | 269/95 |
| 5,562,276 A * | 10/1996 | Blick | ............. | B23Q 1/037 |
| | | | | 269/21 |
| 6,257,564 B1 * | 7/2001 | Avneri | ............. | B25B 11/005 |
| | | | | 269/21 |
| 6,439,559 B1 * | 8/2002 | Kinnard | .......... | B25B 11/007 |
| | | | | 269/21 |
| 9,862,065 B2 * | 1/2018 | Rothkegel | ........ | H01L 21/6838 |
| 2017/0092862 A1 | 3/2017 | Obata et al. | | |

FOREIGN PATENT DOCUMENTS

| | | |
|---|---|---|
| CN | 108608117 A | 10/2018 |
| CN | 109158782 A | 1/2019 |
| CN | 208467576 U | 2/2019 |
| CN | 109494312 A | 3/2019 |
| CN | 110257776 A | 9/2019 |
| CN | 111009621 A | 4/2020 |
| JP | 2011231343 A | 11/2011 |

OTHER PUBLICATIONS

The First Office Action issued on Mar. 3, 2021, in connection with corresponding Chinese Application No. 201911348992.6 (11 pages, including machine-generated English translation).

The Notice of Grant to Patent issued on Nov. 1, 2021, in connection with corresponding Chinese Application No. 201911348992.6 (6 pages, including machine-generated English translation).

* cited by examiner

SCREEN TENSIONING DEVICE

CROSS-REFERENCE OF RELATED APPLICATIONS

The present application is a continuation of International Application No. PCT/CN2020/117924, filed on Sep. 25, 2020, which claims priority to Chinese Patent Application No. 201911348992.6, filed on Dec. 24, 2019, both of which are hereby incorporated by reference in their entireties.

TECHNICAL FIELD

The present application relates to the field of masks, in particular to a screen tensioning device.

BACKGROUND

Organic Light Emitting Diode (OLED) display panels are widely used in various consumer electronic products such as mobile phones, TVs, personal digital assistants, digital cameras, notebook computers and desktop computers due to their high image quality, power saving, thin body and wide application range. The OLED display panels have become the mainstream of display devices.

In the production process of the OLED display panel, organic materials need to be vapor-deposited on the substrate, and a fine metal mask (FMM) is usually used in the vapor deposition process. Before the FMM is used, the mask strip needs to be welded to the mask frame, and this process needs to be carried out on the screen tensioning device.

In the existing screen tensioning device, an air floating ball or an air floating hole is used to blow the mask frame to float the mask frame. However, the use of the air floating ball or the air floating hole to blow the mask frame requires higher flatness of the mask frame.

SUMMARY

The present application provides a screen tensioning device to reduce the requirement of the flatness of the mask frame.

Embodiments of the present application provide a screen tensioning device, which includes: a supporting frame with a mounting surface; and a plurality of air floating assemblies arranged on the mounting surface, and each of the plurality of air floating assemblies includes: an air floating base mounted on the mounting surface; a supporting tray arranged on the side of the air floating base away from the mounting surface, the supporting tray has a first surface facing the air floating base and a second surface arranged opposite to the first surface, and the second surface is configured to support a mask frame; at least one air hole disposed toward the first surface of the supporting tray to float the supporting tray when the air is blown; and a limiting component connected between the air floating base and the supporting tray, the limiting component is configured to limit the displacement of the supporting tray in a direction parallel to the mounting surface.

According to the screen tensioning device of the embodiment of the present application, when the air is blown toward the first surface of the supporting tray through the at least one air hole, the supporting tray floats, and the second surface of the supporting tray can support the mask frame, thereby indirectly causing the mask frame to float. The screen tensioning device of the embodiment of the present application uses gas to act on the supporting tray to make the mask frame float, instead of the gas directly acting on the mask frame. Therefore, compared with the air floating manner using the air floating hole or the air floating ball, the flatness specification of the mask frame is lower, so that the cost of the mask frame can be reduced. In addition, the use of the supporting tray to directly contact the mask frame makes the air floating support of the mask frame by the air floating assembly more stable and reliable, and improves the air floating effect on the mask frame. The air floating assembly further includes a limiting component, which can limit the displacement of the supporting tray in a direction parallel to the mounting surface, thereby further improving the stability of the air floating assembly supporting the mask frame in air floating manner.

In some optional embodiments, the limiting component includes a plurality of supporting posts, and the supporting posts pass through the air floating base and the supporting tray at the same time. When the supporting tray floats, the supporting post can limit the displacement of the supporting tray in the direction parallel to the mounting surface. At the same time, when the supporting tray is not floating or receive excessive pressure, the supporting post can provide support for the supporting tray to avoid the air floating assembly from being damaged, which provides certain protection for the air floating assembly.

DETAILED DESCRIPTION

In order to make the objectives, technical solutions, and advantages of the present application clearer, the following further describes the present application in detail with reference to the accompanying drawings and specific embodiments. It should be understood that the specific embodiments described herein are only configured to explain the present application, and are not configured to limit the present application. For those skilled in the art, this application can be implemented without some of these specific details.

It should be noted that in this article, relational terms such as first and second are only used to distinguish one entity or operation from another entity or operation, and do not necessarily require or imply that there is any such actual relationship or order between these entities or operations.

In the production process of an Organic Light Emitting Diode (OLED) display panel, organic materials need to be vapor-deposited on a substrate, and the vapor deposition process usually requires a fine metal mask (FMM). Before the FMM is used, the mask strip needs to be welded to the mask frame, and this process needs to be carried out on the screen tensioning device. Embodiments of the present application provides a screen tensioning device, and the screen tensioning device of embodiments of the present application will be described in detail below with reference to the accompanying drawings.

Figure 1:
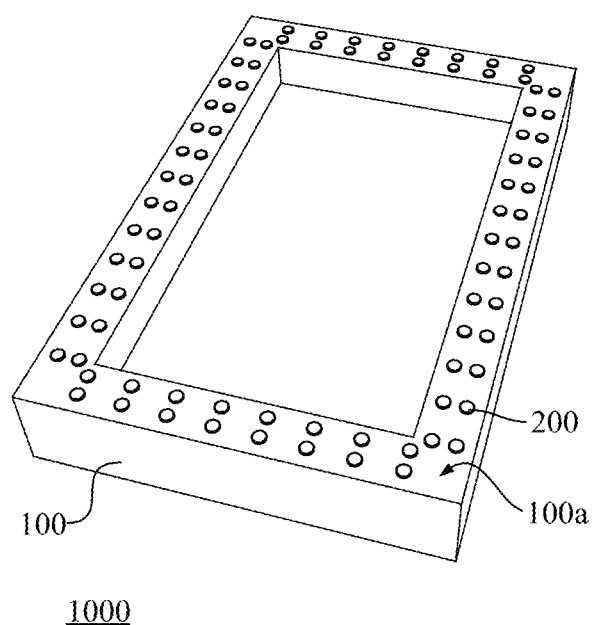
FIG. 1 is an assembled perspective view of a screen tensioning device provided by an embodiment of the present application.
Figure 2A:
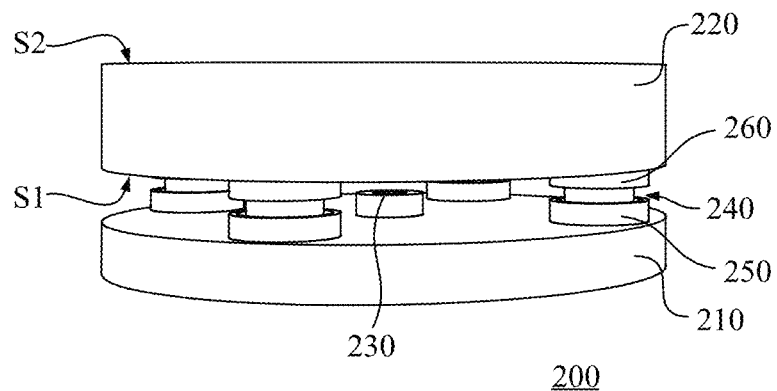
FIG. 2A is a perspective view of the air floating assembly in the screen tensioning device provided by an embodiment of the present application.
Figure 2B:
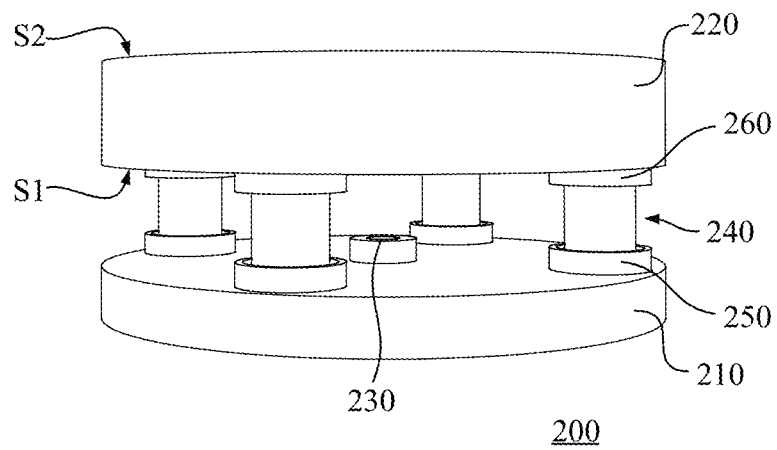
FIG. 2B is another perspective view of the air floating assembly in the screen tensioning device provided by an embodiment of the present application.
Figure 3A:
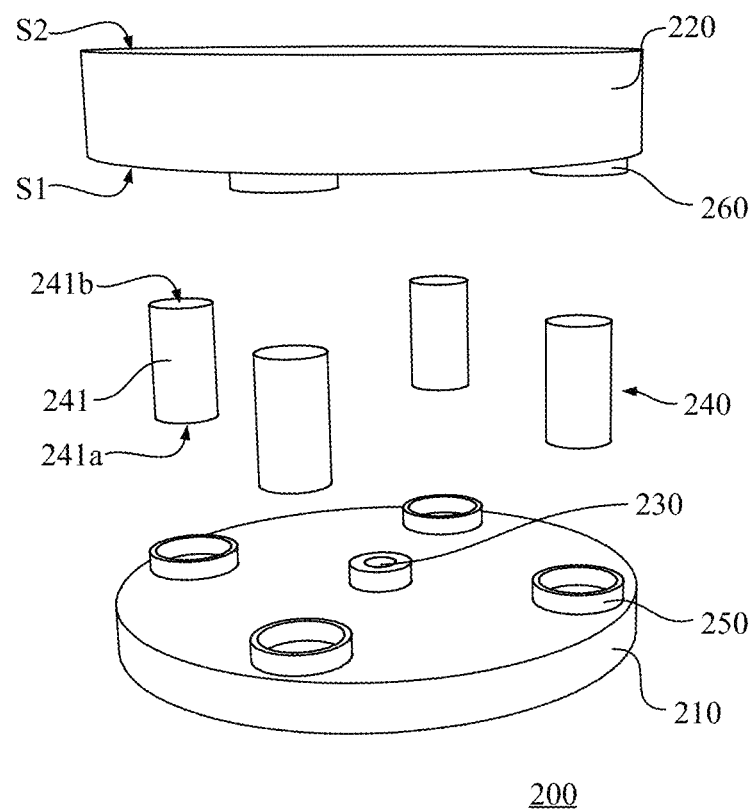
FIG. 3A is an exploded perspective view of the air floating assembly in the screen tensioning device provided by an embodiment of the present application.
Figure 3B:
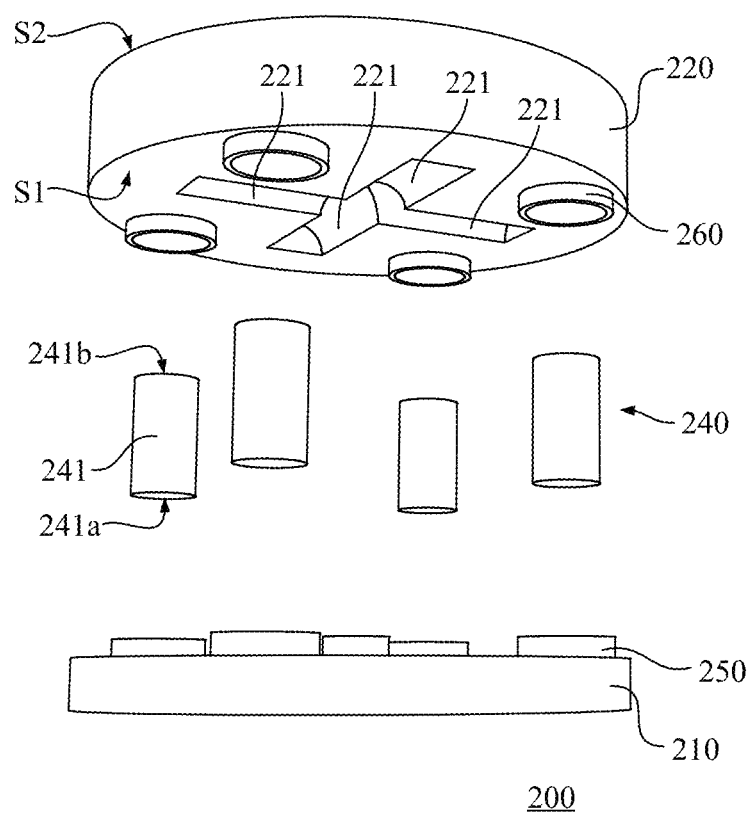
FIG. 3B is another exploded perspective view of the air floating assembly in the screen tensioning device provided by an embodiment of the present application.

FIG. 1 is an assembled perspective view of a screen tensioning device according to an embodiment of the present application. The screen tensioning device 1000 includes a supporting frame 100 and a plurality of air floating assemblies 200. The supporting frame 100 has a mounting surface 100a. A plurality of air floating assemblies 200 are arranged on the mounting surface 100a.

Referring to FIGS. 2A to 3B, each air floating assembly 200 includes an air floating base 210, a supporting tray 220, at least one air hole 230 and a limiting component 240.

The air floating base 210 is mounted on the mounting surface 100a. The supporting tray 220 is disposed on the side of the air floating base 210 away from the mounting surface 100a. The supporting tray 220 has a first surface S1 facing the air floating base 210 and a second surface S2 disposed opposite to the first surface S1 and the second surface S2 is configured to support a mask frame. The at least one air hole 230 is provided on the air floating base 210 and is disposed toward the first surface S1 of the supporting tray 220 so as to float the supporting tray 220 when the air is blown. The limiting component 240 is connected between the air floating base 210 and the supporting tray 220, and the limiting component 240 is configured to limit the displacement of the supporting tray 220 in a direction parallel to the mounting surface 100a.

Figure 4A:
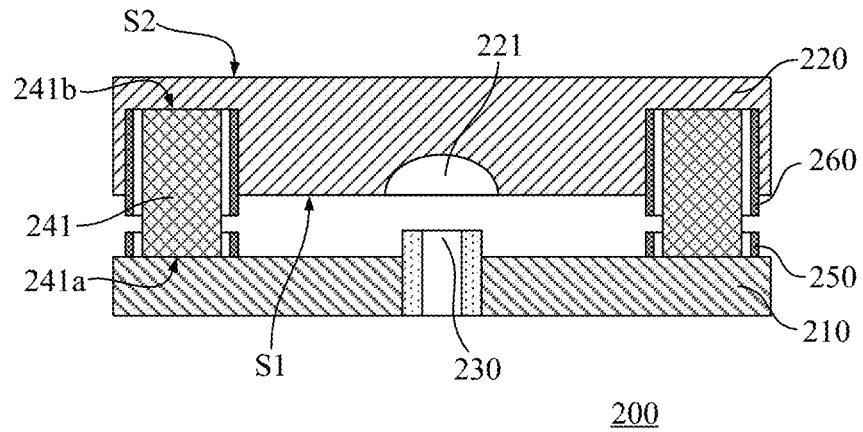
FIG. 4A is a cross-sectional view of the air floating assembly in a screen tensioning device provided by an embodiment of the present application in a non-floating state.
Figure 4B:
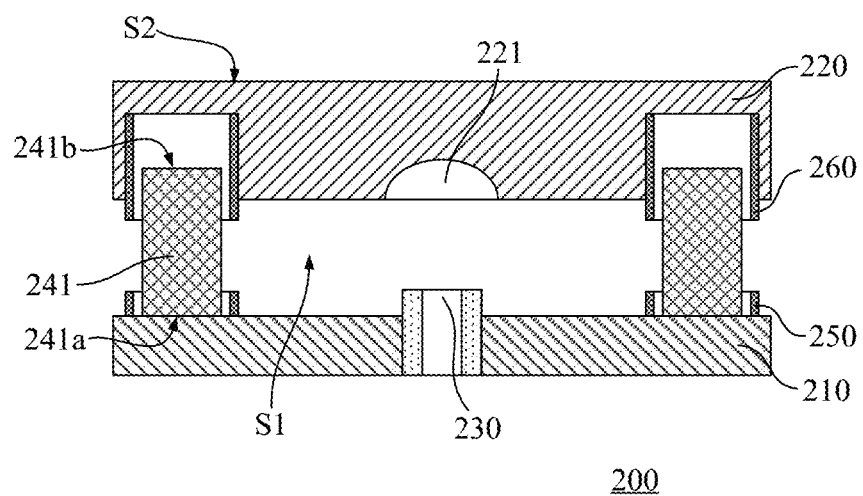
FIG. 4B is a cross-sectional view of the air floating assembly of the screen tensioning device provided by an embodiment of the present application in the floating state.

FIG. 4A is a cross-sectional view of the air floating assembly in a screen tensioning device provided in an embodiment of the present application in a non-floating state, and FIG. 4B is a cross-sectional view of the air floating assembly in a screen tensioning device provided in an embodiment of the present application in a floating state. According to the screen tensioning device 1000 of the embodiment of the present application, when the air is blown toward the first surface S1 of the supporting tray 220 through the at least one air hole 230, the supporting tray 220 floats, and the second surface S2 of the supporting tray 220 can support the mask frame, thereby indirectly making the mask frame float.

In the embodiment of the present application, the screen tensioning device 1000 uses the gas to act on the supporting tray 220 to float the mask frame, instead of the gas directly acting on the mask frame. Therefore, compared to the air floating manner using the air floating hole or the air floating ball, the flatness specification requirement of the mask frame is lower, so that the cost of the mask frame can be reduced.

In addition, the use of the supporting tray 220 to directly contact the mask frame makes the air floating support of the mask frame by the air floating assembly 200 more stable and reliable, and improves the air floating effect on the mask frame.

According to the screen tensioning device 1000 of the embodiment of the present application, the air floating assembly 200 further includes a limiting component 240. The limiting component 240 is configured to limit the displacement of the supporting tray 220 in the direction parallel to the mounting surface 100a, thereby further improving the stability of the air floating assembly 200 supporting the mask frame in air floating manner.

In some embodiments, the limiting component 240 includes a plurality of supporting posts 241. Each supporting post 241 includes a first end portion 241a and a second end portion 241b opposite to each other. The first end portion 241a passes through the air floating base 210, and the second end portion 241b passes through the supporting tray 220. For example, the second end portion 241b passes through the first surface S1 of the supporting tray 220. The supporting tray 220 is movable relative to the supporting post 241 along the axial direction of the supporting post 241.

According to the screen tensioning device 1000 of the embodiment of the present application, the limiting component 240 includes a plurality of supporting posts 241, and the supporting post 241 passes through the air floating base 210 and the supporting tray 220 at the same time. When the supporting tray 220 is floating, the supporting post 241 can limit the displacement of the supporting tray 220 in the direction parallel to the mounting surface 100a. At the same time, when the supporting tray 220 is not floating or receives excessive pressure, the supporting post 241 can provide support for the supporting tray 220 to avoid a damage of the air floating assembly 200, which provides certain protection for the air floating assembly 200.

In some embodiments, the air floating base 210 is provided with a first limiting ring 250 facing the supporting tray 220. The first end portion 241a of the supporting post 241 passes through the inside of the first limiting ring 250 and is engaged with the inner surface of the first limiting ring 250, so that the supporting post 241 can move with a certain displacement in the area defined by the inner surface of the first limiting ring 250, which prevents the support post 241 from deviating too much from the air floating base 210, and improves the stability of the supporting tray 220 when it floats. In some embodiments, the inside radius of the first limiting ring 250 ranges from 0.3 mm to 0.5 mm. In the present embodiment, the inside radius of the first limiting ring 250 is, for example, 0.3 mm.

In some embodiments, the supporting tray 220 is provided with a second limiting ring 260 disposed in the first surface S1, and the second end portion 241b of the supporting post 241 passes through the second limiting ring 260 and is engaged with the inner surface of the second limiting ring 260, so that the support post 241 can move with a certain displacement in the area defined by the inner surface of the second limiting ring 260, which prevents the floating supporting tray 220 from deviating too much from the support post 241 and the air floating base 210 and improves the stability of the supporting tray 220 when it floats. In some embodiments, the inside radius of the second limiting ring 260 ranges from 0.3 mm to 0.5 mm. In the present embodiment, the inside radius of the second limiting ring 260 is, for example, 0.3 mm.

In some embodiments, the supporting tray 220 is cylindrical, and the shape of the air floating base 210 can be configured to match the shape of the supporting tray 220. The plurality of supporting posts 241 are evenly dispersed on the periphery area of the central axis of the supporting tray 220 and the plurality of supporting posts 241 provide an more uniform and stable support for the supporting tray 220.

In the present embodiment, the at least one air hole 230 is provided on the surface of the air floating base 210 facing the supporting tray 220 and is centrally provided on the air floating base 210. In some embodiments, the supporting tray 220 is provided with a plurality of venting grooves 221 disposed in the first surface, and the at least one air hole 230 overlaps with all of the venting grooves 221 along a radial direction of the at least one air hole. In the present embodiment, the plurality of venting grooves are four venting grooves 221, and the four venting grooves 221 are symmetrically arranged with the central axis of the supporting tray 220.

In some embodiments, the screen tensioning device 1000 further includes a gas conveying component. The gas conveying component communicates with the at least one air hole 230 through a tube, and the gas conveying component is configured to convey gas to the at least one air hole 230.

When the mask frame needs to be blown up, the gas conveying component conveys gas to the at least one air hole 230, and the air is blown toward the venting grooves 221 provided on the first surface S1 of the supporting tray 220 through the at least one air hole 230, so that the supporting tray 220 floats and the second surface S2 of the supporting tray 220 contacts with the mask frame, thereby driving the mask frame to float.

In some embodiments, the screen tensioning device 1000 may further include a blowing control component, which is electrically connected to the gas conveying component, and is configured to control the flow rate and the flow rate of the gas delivered to the at least one air hole 230 from the gas conveying component.

In the floating state, four different counter force (CF) values are respectively applied to the mask frame, and after the CF is applied, the pixel position accuracy (PPA) value of the mask is measured. After the CF is released, the same CF value is applied again in the floating state to measure the PPA value of the mask.

Figure 5:
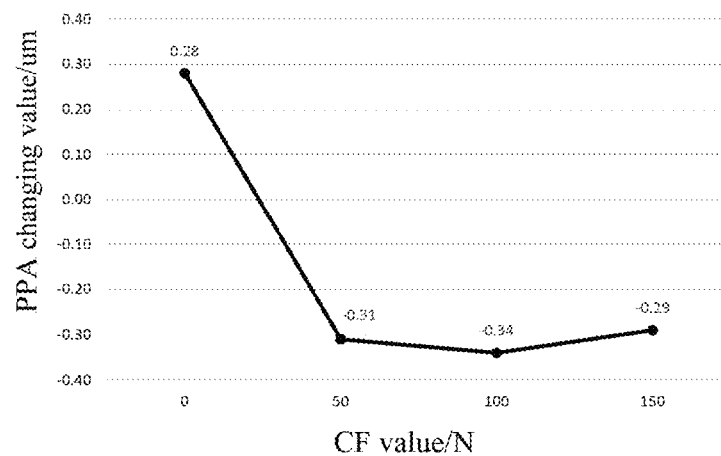
FIG. 5 is a test curve diagram of the changing value of the pixel position accuracy of the screen tensioning device provided by an embodiment of the present application.

FIG. 5 is a test curve diagram of the changing value of the pixel position accuracy of the screen tensioning device provided by an embodiment of the present application. In FIG. 5, the abscissa is the CF value in each group of tests, the unit being N, and the ordinate is the PPA changing value in each group test (the changing amount between the PPA value after the CF is applied and the PPA value after the CF is released), the unit being micrometer (um). According to FIG. 5, when the screen tensioning device 1000 of the embodiment of the present application is applied to the air floating mask frame, the CF is basically completely released in the air floating state, the friction force is negligible, and the air floating effect is good.

When the same mask frame is applied with different air floating amounts, the floating height of the four corners of the mask frame is measured respectively, and the difference value (extreme value) between the maximum and the minimum value is calculated, which can reflect the air floating stability of the screen tensioning device.

Figure 6:
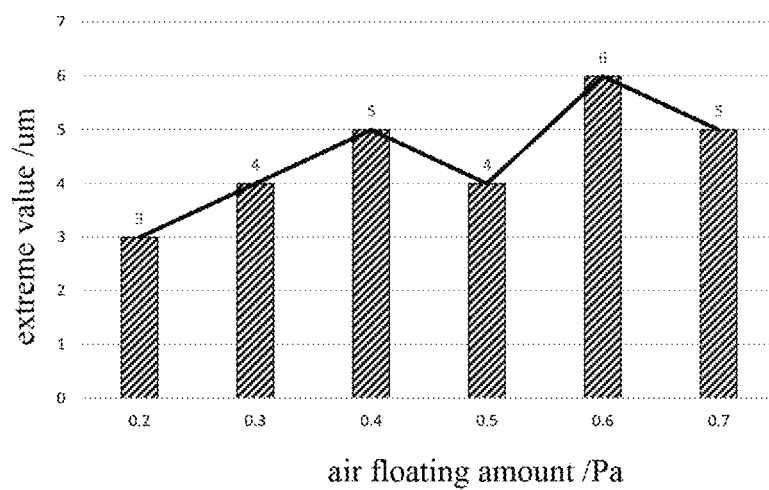
FIG. 6 is a test curve diagram of the extreme values of the floating heights of four corners of the mask frame of the screen tensioning device provided by an embodiment of the present application.

FIG. 6 is a test curve diagram of the extreme values of the floating heights of the four corners of the mask frame of the screen tensioning device provided in an embodiment of the present application. In FIG. 6, the abscissa is the air floating amount in each group of tests, the unit being Pa, and the ordinate is the extreme value of the floating height of the mask frame in each group of tests (the difference value between the maximum value and the minimum value of the floating height of the four corners of the mask frame), the unit being micrometer (um). According to FIG. 6, when the screen tensioning device 1000 of the embodiment of the present application is applied to the air floating mask frame, the floating height difference of the mask frame at various positions is very small, and the stability of the air floating assembly is good.

In the above-mentioned embodiment, the at least one air hole 230 is provided in the air floating base 210. In other embodiments, the at least one air hole 230 may also be provided in other positions.

Figure 7A:
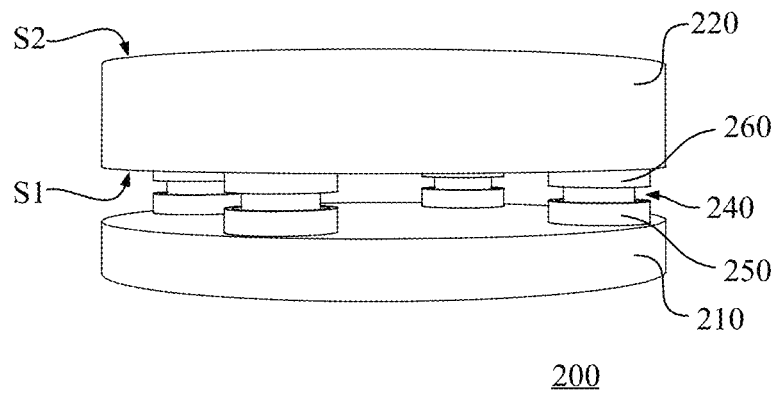
FIG. 7A is a perspective view of the air floating assembly in the screen tensioning device provided by an alternative embodiment of the present application.
Figure 7B:
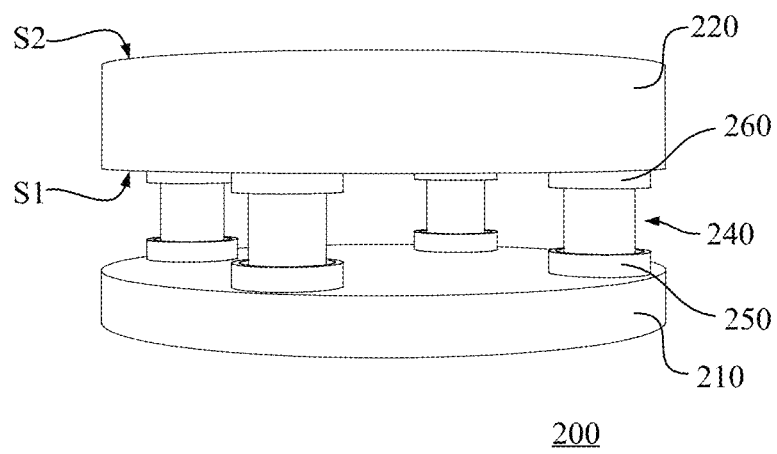
FIG. 7B is a perspective view of the air floating assembly in the screen tensioning device provided by an alternative embodiment of the present application.
Figure 8:
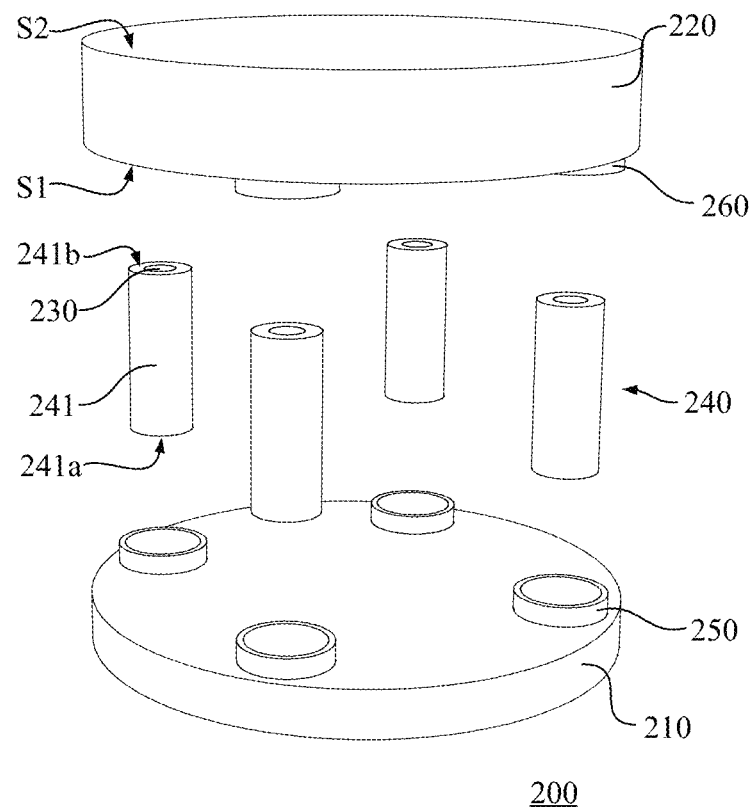
FIG. 8 is an exploded perspective view of the air floating assembly in the screen tensioning device provided by an alternative embodiment of the present application.

Referring to FIGS. 7A to 8, part of the structure of the alternative embodiment is the same as the structure of the foregoing embodiment, and will not be described in detail here.

In an alternative embodiment, each air floating assembly 200 includes an air floating base 210, a supporting tray 220, at least one air hole 230 and a limiting component 240. The limiting component 240 includes a plurality of supporting posts 241. Each supporting post 241 includes a first end portion 241a and a second end portion 241b opposite to each other. The first end portion 241a passes through the air floating base 210, and the second end portion 241b passes through the supporting tray 220. The supporting tray 220 is movable relative to the supporting post 241 in the axial direction of the supporting post 241.

In an alternative embodiment, the at least one air hole 230 is a plurality of air holes. At least one of the plurality of air holes 230 is provided on a surface of the second end portion 241b of each supporting post 241.

Figure 9A:
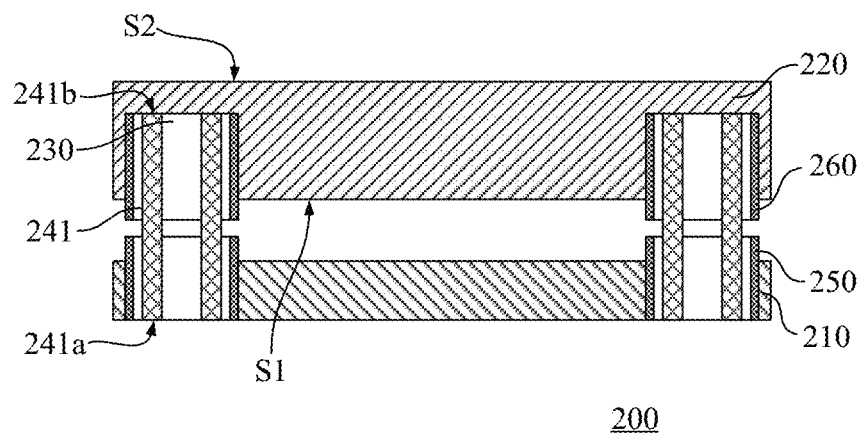
FIG. 9A is a cross-sectional view of the air floating assembly in a screen tensioning device provided by an embodiment of the present application in a non-floating state.
Figure 9B:
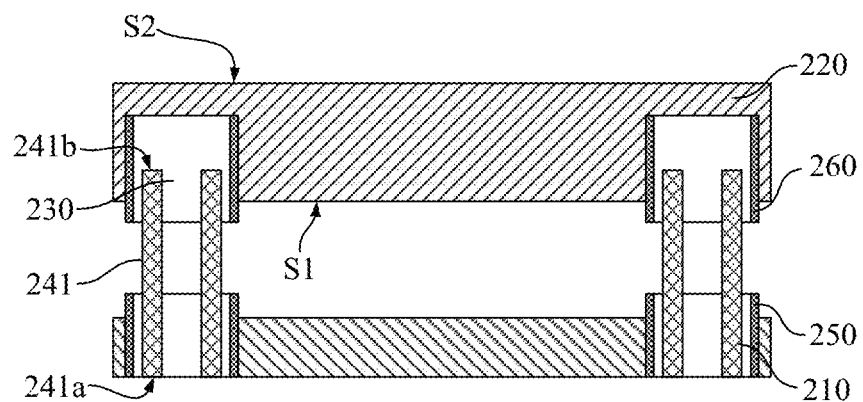
FIG. 9B is a cross-sectional view of the air floating assembly of the screen tensioning device provided by another embodiment of the present application in the floating state.

FIG. 9A is a cross-sectional view of the air floating assembly in the screen tensioning device provided by an embodiment of the present application in a non-floating state, and FIG. 9B is a cross-sectional view of the air floating assembly in the screen tensioning device provided by another embodiment of the present application in a floating state. When the mask frame needs to be blown up, the gas conveying component delivers gas to the at least one air hole 230, and the air is blown toward the first surface S1 of the supporting tray 220 through the at least one air hole 230 to float the supporting tray 220 and contact the second surface S2 of the supporting tray 220 with the mask frame, thereby driving the mask frame to float.

In the embodiment, the limiting component 240 includes a plurality of supporting posts 241, but in other embodiments, the structure of the limiting component 240 may not be limited to this. For example, in some other embodiments, the limiting component 240 includes a plurality of elastic members, wherein one end of each elastic member is connected to the air floating base, and the other end is connected to the supporting tray 220. When the air is blown toward the supporting tray 220 through the at least one air hole 230 to cause the supporting tray 220 to float, the elastic force of the plurality of elastic members can limit the relative position of the supporting tray 220 and the air floating base 210 to a certain range, thereby restricting the displacement of the supporting tray 220 in the direction parallel to the mounting surface 100a and improving the stability of the air floating assembly 200 supporting the mask frame in air floating manner.

According to the screen tensioning device 1000 of the embodiment of the present application, since the gas acts on the supporting tray 220 to cause the mask frame to float, instead of the gas directly acting on the mask frame, compared to the air floating manner using the air floating hole or the air floating ball, the flatness specification of the mask frame is lower, so that the cost of the mask frame can be reduced. In addition, the use of the supporting tray 220 to directly contact the mask frame makes the air floating assembly 200 supporting the mask frame in air floating manner more stable and reliable, thereby improving the air floating effect of the mask frame. The air floating assembly 200 further includes a limiting component 240, which can limit the displacement of the supporting tray 220 in the direction parallel to the mounting surface 100a, thereby further improving the stability of the air floating assembly 200 supporting the mask frame in air floating manner.

According to the above-mentioned embodiments of the present application, these embodiments do not describe all the details in detail, nor do they limit the present application to only the specific embodiments described. Obviously, according to the above description, many modifications and changes can be made. This specification selects and specifically describes these embodiments in order to better explain the principles and practical applications of the present application, so that the skilled person in the art can make good use of the present application and make modifications on the basis of the present application. The present application is only limited by the claims and their full scope and equivalents.

What is claimed is:

1. A screen tensioning device, comprising:
a supporting frame with a mounting surface; and
a plurality of air floating assemblies arranged on the mounting surface, wherein each of the plurality of air floating assemblies comprises:
an air floating base mounted on the mounting surface;
a supporting tray arranged on a side of the air floating base away from the mounting surface, wherein the supporting tray comprises a first surface facing the air floating base and a second surface disposed opposite to the first surface, and the second surface being configured to support a mask frame;
at least one air hole disposed toward the first surface of the supporting tray to float the supporting tray when air is blown; and
a limiting component connected between the air floating base and the supporting tray, wherein the limiting component is configured to limit a displacement of the supporting tray in a direction parallel to the mounting surface, the limiting component comprises a plurality of supporting posts, and the supporting tray is movable relative to the plurality of supporting posts along an axial direction of the plurality of supporting posts.

2. The screen tensioning device according to claim 1, each supporting post of the plurality of support posts comprises a first end portion and a second end portion opposite to each other, the first end portion passes through the air floating base, and the second end portion passes through the supporting tray.

3. The screen tensioning device according to claim 2, wherein the air floating base is provided with a first limiting ring facing the supporting tray, and the first end portion of the supporting post penetrates through the inside of the first limiting ring and is engaged with an inner surface of the first limiting ring.

4. The screen tensioning device according to claim 3, wherein an inside radius of the first limiting ring ranges from 0.3 mm to 0.5 mm.

5. The screen tensioning device according to claim 3, wherein the supporting tray is provided with a second limiting ring disposed in the first surface, and the second end portion of the supporting post passes through the second limiting ring and is engaged with an inner surface of the second limiting ring.

6. The screen tensioning device according to claim 5, wherein an inside radius of the second limiting ring ranges from 0.3 mm to 0.5 mm.

7. The screen tensioning device according to claim 2, wherein the at least one air hole is a plurality of air holes, wherein at least one of the plurality of air holes is provided on a surface of the second end portion of each of the plurality of support posts.

8. The screen tensioning device according to claim 1, wherein a shape of the air floating base is configured to match a shape of the supporting tray.

9. The screen tensioning device according to claim 2, wherein the supporting tray has a cylindrical shape, and the plurality of supporting posts is evenly dispersed on the peripheral area of a central axis of the supporting tray.

10. The screen tensioning device according to claim 1, wherein the at least one air hole is provided on a surface of the air floating base facing the supporting tray and is centrally arranged on the air floating base.

11. The screen tensioning device according to claim 1, wherein the supporting tray is provided with a plurality of venting grooves disposed in the first surface and the at least one air hole overlaps with all of the venting grooves along a radial direction of the at least one air hole.

12. The screen tensioning device according to claim 11, wherein the plurality of venting grooves comprises four venting grooves and the four venting grooves are disposed symmetrically with a central axis of the supporting tray.

13. The screen tensioning device according to claim 3, wherein the supporting post is configured to move with a certain displacement in an area defined by the inner surface of the first limiting ring.

14. The screen tensioning device according to claim 5, wherein the support post is configured to move with a certain displacement in an area defined by the inner surface of the second limiting ring.

* * * * *